United States Patent [19]

Jackson et al.

[11] Patent Number: 5,790,255
[45] Date of Patent: Aug. 4, 1998

[54] TRANSPARENT LIGHT BEAM DETECTORS

[75] Inventors: Warren B. Jackson, San Francisco; Mark H. Yim, Palo Alto; Andrew A. Berlin, San Jose, all of Calif.

[73] Assignee: Xerox Corporation, Stamford, Conn.

[21] Appl. No.: 798,328

[22] Filed: Feb. 10, 1997

[51] Int. Cl.[6] .................................................. G01B 11/14
[52] U.S. Cl. .......................... 356/375; 356/373; 356/382; 356/386
[58] Field of Search ............................... 356/375, 373, 356/382, 386

[56] References Cited

U.S. PATENT DOCUMENTS

| | | | |
|---|---|---|---|
| 4,334,775 | 6/1982 | Breecher et al. | 356/152 |
| 4,623,253 | 11/1986 | Okutani et al. | 356/375 |
| 4,870,290 | 9/1989 | Deck | 250/561 |
| 5,023,845 | 6/1991 | Crane et al. | 364/508 |
| 5,321,474 | 6/1994 | Bares | 355/247 |
| 5,347,132 | 9/1994 | Holzman et al. | 250/389 |
| 5,383,368 | 1/1995 | Franke et al. | 73/800 |
| 5,418,608 | 5/1995 | Caimi et al. | 356/3.01 |
| 5,442,251 | 8/1995 | Kaida et al. | 310/321 |
| 5,490,089 | 2/1996 | Smith et al. | 364/514 |
| 5,519,483 | 5/1996 | Kawanishi et al. | 355/311 |
| 5,522,375 | 6/1996 | Leibach et al. | 267/140.14 |
| 5,530,548 | 6/1996 | Campbell et al. | 356/375 |

*Primary Examiner*—Frank G. Font
*Assistant Examiner*—Reginald A. Ratliff
*Attorney, Agent, or Firm*—Robert A. Burtzlaff

[57] ABSTRACT

A system of partially transparent light beam detectors that allow passage of the light beam through the detector allows multiple detectors that use the same reference light beam. Transparent detectors can be position sensitive detectors (PSD), photodiode arrays, or CCD imaging arrays. The detectors are attached to vibration susceptible structural elements, with detected movement of the light beam with respect to the partially transparent light beam detectors corresponding to movement of the vibration susceptible structural element.

21 Claims, 11 Drawing Sheets

TRANSPARENT LIGHT BEAM DETECTORS

This invention was made with United States Government support awarded by Defense Advanced Research Project Agency (DARPA) under Contract No. DABT63-95-C-0025. The United States Government has certain rights in this invention.

FIELD OF THE INVENTION

The present invention is a system for monitoring light beam movement using substantially transparent or semi-transparent light detectors. More particularly, the present invention is a detector system capable of monitoring vibrations using multiple transparent detectors.

BACKGROUND AND SUMMARY OF THE INVENTION

Accurate and low cost monitoring of transient vibrational, translational or torsional movements of structures having meter scale dimensions is useful for many applications. Of particular interest is monitoring printers, including xerographic, laser, or ink jet printers, for vibrational movements that may range from high frequency acoustic flexure modes (10–20 kHz) to sub-Hz (less than 1 Hz) repetitive or transient mechanical flexure. Vibration measurement can include monitoring for machine breakage, for machine wear (e.g. predictive maintenance monitoring), or even identification of failing components based on characteristic vibration signatures. For certain applications, measuring structure movement or vibration can allow application of tensional, inertial, or acoustic based techniques for vibration suppression or noise cancellation as part of an active vibration control system.

The vibration or transient flexure sensor used in such systems must generally be reliable, accurate, and have low power requirements. In the past, attached strain gauges or interferometric detection systems have been used to detect low frequency or intermittent mechanical flexure of a structural element. Unfortunately, such systems generally suffer from high cost, difficulties in ensuring reliable coupling between the structural element and the detectors, and susceptibility to unreliable measurements due to high frequency vibrations or other interference. In particular, strain gauges can be difficult to calibrate because of thermal and coupling effects, especially when connected to relatively small structural elements that may have their flexural characteristics non-linearly modified by the strain gauge connection.

In contrast, while acoustic microphone based systems are more suited to measure higher frequency, acoustic noise than strain gauges, due to their relatively low sensitivity at low frequencies acoustic microphones still do not provide an optimal solution for vibration measurement over a wide range of frequencies. More recently, micromachined or microfabricated vibration sensors have been tried for vibration detection. For example, microsensors based on etched semiconductor beams, weighted cantilevers, or movable diaphragms constituting a mass and spring system that transforms spring deflection, compression, or extension into a measurable time domain electrical signal have been constructed. The electrical signal is generated or modulated with the use of coupled piezoresistors, piezoelectric materials, or through capacitance changes. Unfortunately, like acoustic microphones, the vibration frequency bandwidth can be limited in such spring type beam or cantilever devices, often being restricted to measurement below the first resonant frequency due to strong non-linearities in spring response. This problem is particularly acute for high vibration frequencies, resulting in reduced overall sensor effectiveness when a large vibration frequency bandwidth is to be measured.

The present invention provides a novel system for measuring vibrational, translational, torsional, flexural or other movements of structural elements using novel partially transparent light beam detectors. A particularly preferred partially transparent light beam detector is a position sensitive detector (PSD) composed of multiple transparent or partially transparent layers to allow passage of a light beam therethrough, with typically more than half of the light (i.e. the measured light intensity) entering the PSD being allowed to exit. Layers may include, but are not limited to, p-i-n detectors having edge mounted electrodes, or appropriately doped amorphous silicon layers. Position sensitive detectors as conventionally defined and defined herein include lateral effect light sensors that produce two electrical signals indicative of the centroid of light beam position. Alone or in combination, partially transparent PSD's in accordance with the present invention can provide one, two, or three dimensional information regarding light beam position.

Alternatively, transparent light beam detectors can include close groupings of transparent photodiodes, or even transparent CCD imaging sensors. In addition, PSD's or other transparent light beam detectors in accordance with the present invention can be modified to have partially reflective layers to redirect a portion of a light beam prior to detection. Combinations of transparent, semi-reflective, and conventional opaque light beam detectors are also contemplated to be within the scope of the present invention, allowing for diverse optical arrangements for measuring light beam position using a single light beam.

Measurement of relative light beam movement is possible over a large range of frequencies, from slow movements having time scales on the order of seconds, to high frequency 10 kHz or greater acoustic measurements. The present invention includes a directed light source for generating a light beam, such as may be provided by a laser beam or highly focused light beam. The light beam is directed to intersect a first partially transparent light beam detector (e.g. a transparent PSD) attached to a first structural element, with the first partially transparent light beam detector allowing at least some of the light beam to exit. Because of the attachment between the light beam detector and the first structural element, detected movement of the light beam with respect to the first partially transparent light beam detector corresponds to movement of the first structural element. To allow for multiple measurement of structure movement, a second light beam detector is attached to a second structural element to intercept the light beam exiting from the first partially transparent light beam detector, with detected movement of the light beam with respect to the second light beam detector corresponding to movement of the second structural element. As will be appreciated, the first and second structural elements can be unitary (e.g. a single flexible beam or panel supporting multiple detectors), coupled by fixed or movable joints (e.g. a linked beam structure, with each beam supporting a detector), or even mechanically isolated from each other.

By tracking one, two, or three dimensional movement of the detected light beam, the flexure or vibration of the structural element over a wide range of frequencies can be determined. Advantageously, the use of partially transparent light beam detectors allows stacking a line of detectors along a beam, sidewall, or other structural element, with all the detectors using the same directed light source to determine movement of the structural element(s). For example, a sidewall of a large printer (having flexural and acoustic characteristics that have been likened to a large metal plate or drum) can be equipped with a number of linearly arranged light beam detectors. A single laser beam can be directed to pass through any line of partially transparent detectors to determine unwanted vibration of the attached sidewall, with appropriate beam bending, splitting, and scanning techniques allowing multiple lines of detectors to be serviced using only a single light source. Using this measured vibration data, vibration or noise canceling techniques can be employed to substantially reduce printer vibration and noise.

Advantageously, the present invention allows vibration monitoring and correction in structural elements maintained in tension, as well as the previously discussed beam, plate or shell type structural elements. For example, in certain xerographic printer systems, an electrode wire or ribbon susceptible to undesired mechanical vibrations is positioned between a donor roll and a latent image to form a powder cloud of toner to develop the latent image. A light beam detector system in accordance with the present invention can be used to monitor vibration modes of the electrode wire, and supply input to a suitable vibration damping control system. One possible control system for canceling mechanical vibration of the electrode wire may be provided by positioning a magnet adjacent to the electrode ribbon, and using low-frequency AC passed through the electrode wire to suppress vibrations through application of electromagnetic forces acting on the wire from the interaction of the AC with the magnetic field.

In addition to meter or sub-meter scale applications such as printers, large scale vibrating or flexing structural elements having linear dimensions measured in meters or even hundreds of meters can be measured in accordance with present invention. For example, tie wires, columns, or beams in buildings or other large structures can be monitored in accordance with the present invention. Suitably scaled or modified flexural or vibration control systems can optionally be used to suppress unwanted structural movements. This would permit monitoring and correction of undesired vibrations or flexures of buildings attributed to large scale movements such as may be encountered in conjunction with wind or earth movements.

Additional functions, objects, advantages, and features of the present invention will become apparent from consideration of the following description and drawings of preferred embodiments.

DETAILED DESCRIPTION OF THE INVENTION

Figure 1:
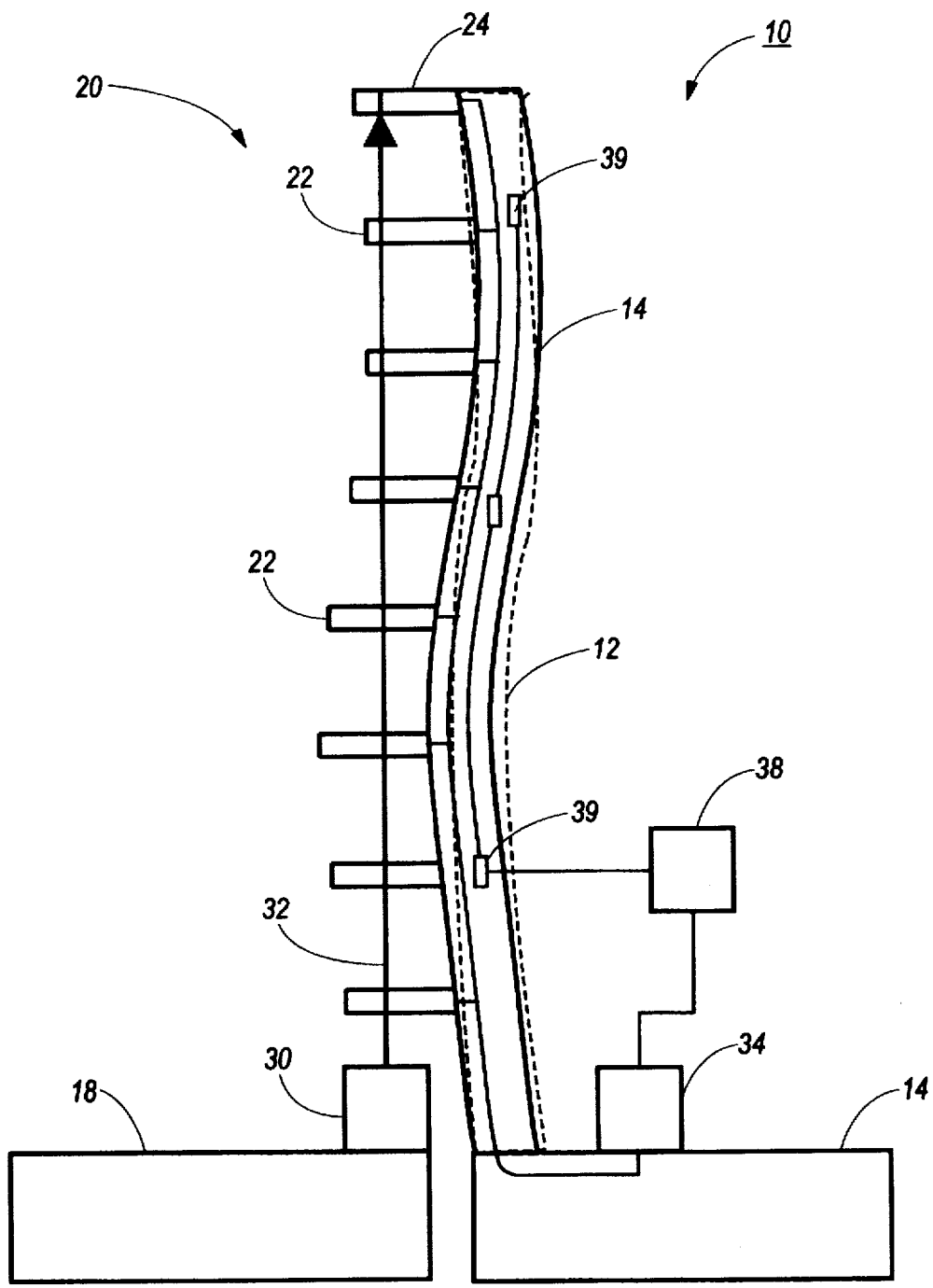
FIG. 1 is a schematic illustration of a structural element subject to flexure or buckling monitored for movement using partially transparent light beam detectors.

A system 10 for monitoring and optionally controlling movement of a structural element is illustrated in FIG. 1. The structural element is represented by a vertically extending beam 12 (dotted outline), connected at its base to a substrate 14 and subject to differential torsional or flexural bending movements such as may be caused by wind induced movements, earth movements, transient shock vibrations, vibration induced by mechanically or acoustically coupled oscillating devices or machinery, or even induced acoustic vibrations. The solid outline 14 of the beam 12 is an instantaneous representation (in greatly exaggerated form) of a possible beam position after movement. As will be appreciated, the beam 12 is intended to represent a wide variety of structural elements subject to tension, flexure, vibration, shock, or compression, including but not limited to columns, cantilever beams, supported beams, crosspieces, plates, shells, tie wires, ribbons, meshes, grates, stressed concrete, or other conventional structural elements for fixed or movable devices. For the purposes of the present invention, the term structural element is also contemplated to extend to combinations of foregoing structural elements, maintained in combination by welds, pins, laminations, adhesives, slipjoints, pivot joints, ball and socket joints, or other conventional tying mechanisms for holding structural elements either immovable or movable with respect to each other.

The system 10 for detection of beam movement includes a directed light source 30 such as may be provided by a laser, focused non-coherent light source, or focused light emitting diode. The emitted light beam is typically at optical frequencies, but light at infrared, ultraviolet or other suitable frequencies can also be employed. Preferentially, the directed light source 30 is attached at a known fixed position to a solid substrate 18, and is relatively immovable with respect to substrate 14 and beam 12. As seen in FIG. 1, the light source 30 directs a light beam 32 in a vertical direction, adjacent and substantially parallel to the vertically extending beam 12. To detect movement of the beam 12 with respect to the fixed directed light source 30, a stacked light beam position detection system 20 is employed. Multiple partially transparent light beam detectors 22 (and a single terminating opaque light beam detector 24) are attached in a vertical line to beam 12. Each partially transparent light beam detector 22 allows at least some of the light beam to exit, while the non-exiting remainder of the light beam 32 in each detector 22 is converted into digital or analog electrical signals representative of one, two, or three dimensional light beam position in each detector. For best results, the transparency of the detectors 22 can be adjusted to provide for capture of about 1/N of incident light, where N is the number of stacked detectors. However, provided the sensitivity is suitably high and a small number of stacked detectors is used, detectors that capture as much as 50% of the light can be used.

Signals produced by detectors 22 are passed to a detection control unit 34 capable of integrating all received signals for interpretation, analysis, and optional transfer to a motion control unit 38. The detection control unit 34 can be of conventional construction, and as appreciated by those skilled in the art can include wireless transceivers, analog/digital converters, signal processing hardware, and a general purpose computer or custom designed board to analyze signals received from the detectors 22.

As illustrated in FIG. 1, the motion control unit 38 can receive signals from the detection control unit 34 indicating beam movement. In response, the motion control unit 38 can signal a plurality of motion controllers 39 mounted on the beam 12 to impart selected forces to counteract, damp, or otherwise minimize undesired movements (and of course selectively enhance movements if desired). The motion controllers 39 can include, but are not limited to, inertial controllers that shift mass, spring or tensile controllers, contractile wires, fibers, or strips, electromagnetic or electrostatic controllers, or any other suitable mechanism or actuator known to those skilled in the art for actively imparting movement constraining or movement enhancing forces to beam 12.

Advantageously, system 10 allows the apparent detected movement of the light beam 32 with respect to each partially transparent light beam detector to be related to corresponding actual movement of the adjacent attached portion of beam 12, using only a single reference light beam 32. Since the absolute or actual position of the light beam is known in at least one or two dimensions, and the relation between measured light beam movement and actual movement of beam 12 is substantially linear, the absolute movement of the beam at each detector attachment site can be easily determined by conventional procedures known to those skilled in the art. As will be appreciated, by use of a sufficiently powerful light source, in conjunction with high light transmissivity detectors (e.g. typically 90% to 95% light transmission therethrough), large numbers of stacked detectors, measuring movement of a single light beam, can be employed to increase precision of beam movement measurements.

Figure 2:
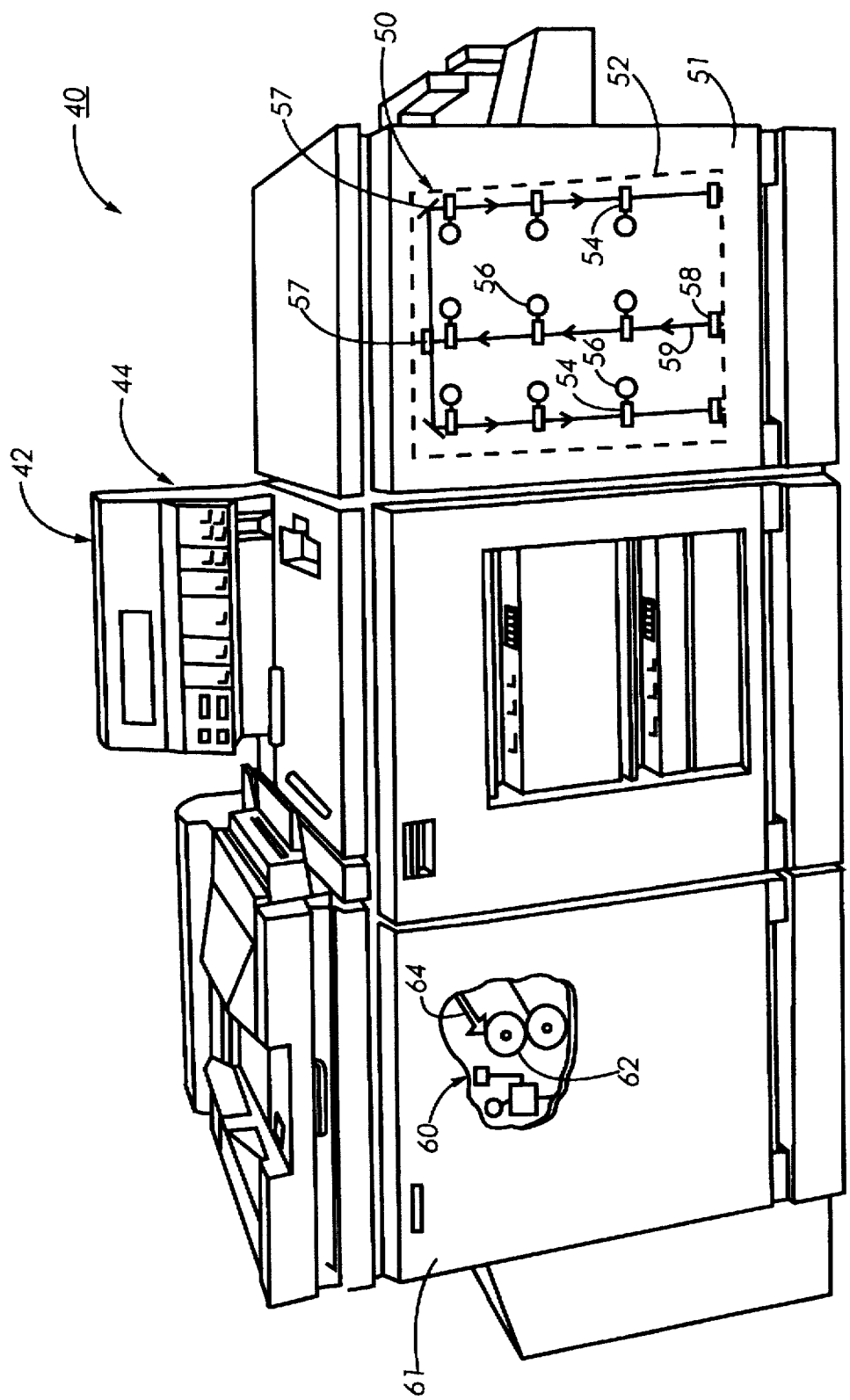
FIG. 2 is a schematic illustration of a xerographic printer panel subject to noise inducing vibration, with multiple stacked partially transparent light beam detectors and vibration control units mounted on the panel.

One exemplary application of the present invention for detecting and optionally controlling movement of structural elements is illustrated in FIG. 2, which shows a printer system 40 having multiple vibration inducing components in partially cut away perspective view. Vibration can be induced by movement of belts, rollers, ratchet mechanisms, reciprocating arms, or other conventional moving components of printer systems. The printer system 40 illustrated in the present embodiment is a modification of xerographic printer such as disclosed, for example, in U.S. Pat. No. 5,321,474, assigned to Xerox Corp., the disclosure of which is herein specifically incorporated by reference. However, as will be appreciated the present invention can be used in a wide variety of printing systems, including but not limited to thermal ink jet printers, continuous ink jet printers, raster output scanning laser printers, or even offset or lithographic printers.

As shown in FIG. 2, the printer system 40 has a vibration detection and suppression unit 50 mounted on the inside (as indicated by dotted outline 52) of panel 51. The unit 50 includes a laser light beam source 58 that directs a light beam 59 to pass through a number of partially transparent light beam detectors 54 distributed along the panel. In the illustrated embodiment, a beam splitter 55 and mirrors 57 are used to redirect the light beam 59 to those detectors 54 not in direct line with the laser light beam source 58. However, as those skilled in the art will appreciate, other light beam redirecting or bending systems can be used, including light scanners, polygon scanners, fiber optics, or prisms. For certain applications, design of detectors capable of refractive bending of light to redirect a beam pass through is contemplated (e.g. prism detectors). If information regarding light edge position, rather than light spot position is adequate (e.g. in conjunction with one dimensional detectors), various light diffusers or spreaders can also be used.

Each detector 54 is associated with a movement controller 56 that can be used to damp panel vibrations. The controllers 54, as well as the detectors 54 are connected to a detection and control unit 44 that integrates received signals from the detectors 54 to determine and implement a control strategy for damping vibration in the panel 51. As shown in FIG. 2, the detectors 54 and controllers 56 can be hardwired to the detection and control unit 44. Alternatively, signal acquisition from detectors or signal distribution to controllers can be through wireless mechanisms, such as are possible with near field radio transmissions or infrared transmission. Alternative transmission systems, including bus based electrical systems, optical fiber based systems, acoustic transmission systems, or any other conventional data transfer scheme can also be used. Although a centralized detection and control unit is shown in FIG. 2, various decentralized or hierarchical detection and control schemes are also contemplated to be within the scope of the present invention.

Figure 3:
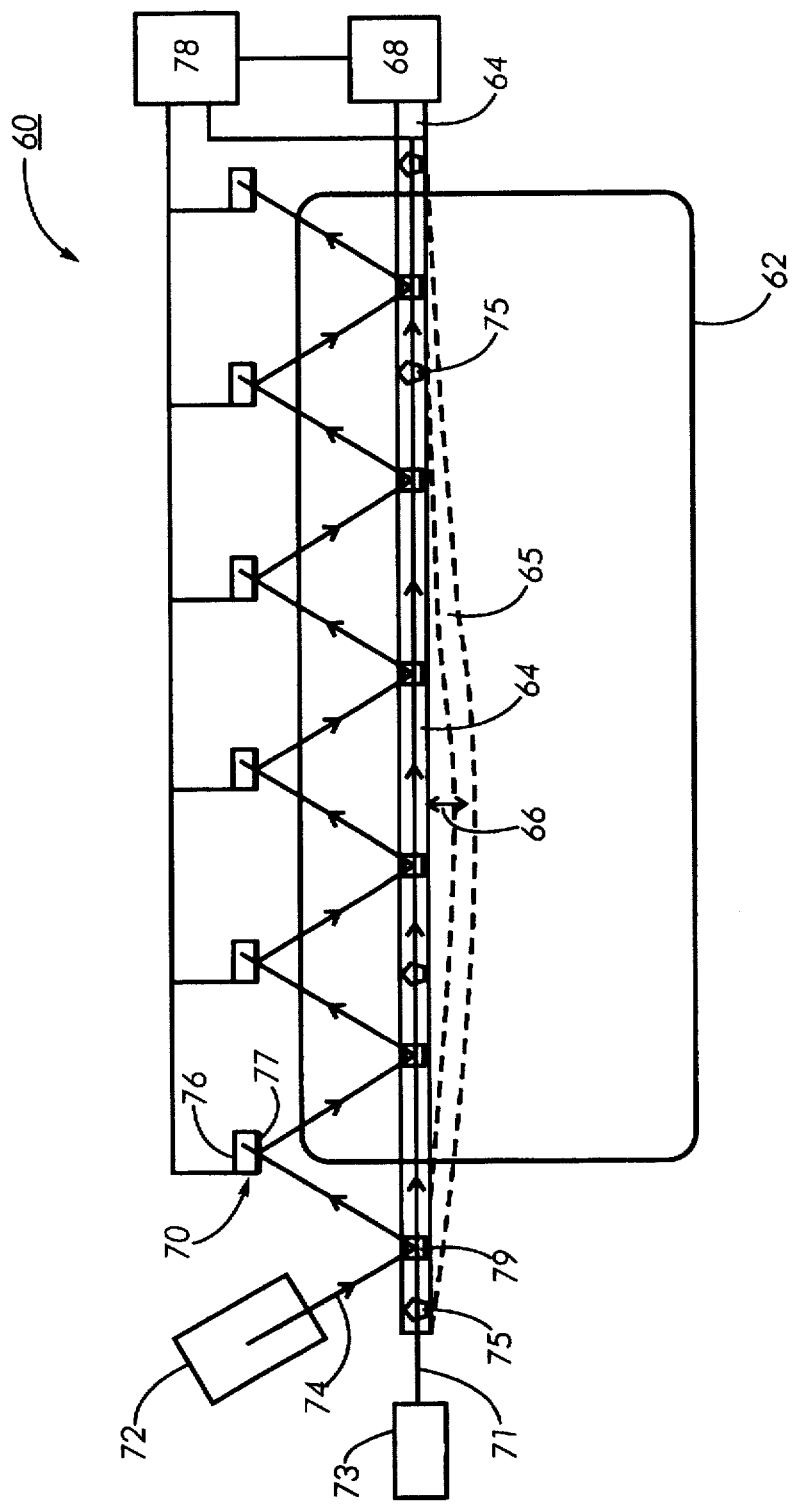
FIG. 3 is a more detailed schematic illustration of a development apparatus for the xerographic printer of FIG. 2, with a plurality of partially reflective light beam detectors for vibration detection, and an active control unit for damping vibration of an electrode ribbon maintained under tension being illustrated.

FIGS. 2 and 3 also illustrate an alternative vibration damping system 60 positioned behind panel 61 in FIG. 2. The system 60, seen in top schematic view in FIG. 3, includes a donor roll 62, along which extends an electrode ribbon 64. As discussed in U.S. Pat. No. 5,321,474, the disclosure of which is herein specifically incorporated by reference, electrode ribbons or wires maintained under tension tend to vibrate in response to printer vibrations, causing irregularities in printer development. While such vibrations can be damped by suitable electromagnetic control such as described in the foregoing U.S. Pat. No. 5,321,474, a high quality vibration detection system is required for best results in vibration damping. In accordance with the present invention, and as best seen, in conjunction with FIG. 3, the present invention provides a vibration detection system 70 that includes semireflective light beam detectors 76, each with semireflective coating 77, and partially transparent light beam detectors 79 mounted on the ribbon 64. A detector controller 78 connected to the detectors 75 and 76 is connected to a motion control unit 68 connected to ribbon 64 to apply an electric signal capable of modifying ribbon movement.

As can be seen in FIG. 3, the electrode ribbon 64 (positioned alongside donor roll 62) may undesirably vibrate to a position 65 as indicated by arrow 66. To aid in detection of vibration, the ribbon 65 can be modified to support either reflective spots 79 or orthogonally mounted, partially transparent detectors 75. A light beam 74 from a light source 72 can be directed to reflect from the spots 79, bouncing between an array of spots 79 and semireflective detectors 76, with detected light beam movement corresponding to ribbon 64 movement. Alternatively, a light beam 71 from a light source 74 can be directed to pass through a series of partially transparent light beam detectors 79 mounted to extend perpendicular from ribbon 64, with detected light beam movement again corresponding to ribbon 64 movement. In response to detected ribbon movement, signals from detector controller 78 can be sent to motion control unit 68 to damp ribbon movement.

If vibration damping such as previously described is not required, vibration diagnosis using semitransparent detectors in accordance with present invention may also be useful. For example, the acoustic vibrations or low frequency physical movements can simply be detected, with no attempt being made to damp or control the vibrations. After vibrations are detected, a vibration frequency spectrum can be obtained, and this spectrum compared to known vibration frequency spectra indicative of potential problems by a diagnostic computer 42 connected to detection and control unit 44. The diagnostic computer 42 allows for automatic determination of prospective or actual failure modes, coupled with automatic or user requested service and maintenance. As will be appreciated, remote connections to diagnostic computers in printer service organizations through TCP/IP (internet) protocols or other suitable communication system can be used. Such remote connections would allow service personnel to become aware of prospective failure in the printer even before the customer was aware of the existence of any problem. A suitable diagnostic computer system that offers both diagnostic services and supports feedback control is described in U.S. Pat. No. 5,490,089 to Smith et al., assignee Xerox Corporation, the disclosure of which is hereby specifically incorporated by reference.

Figure 4:
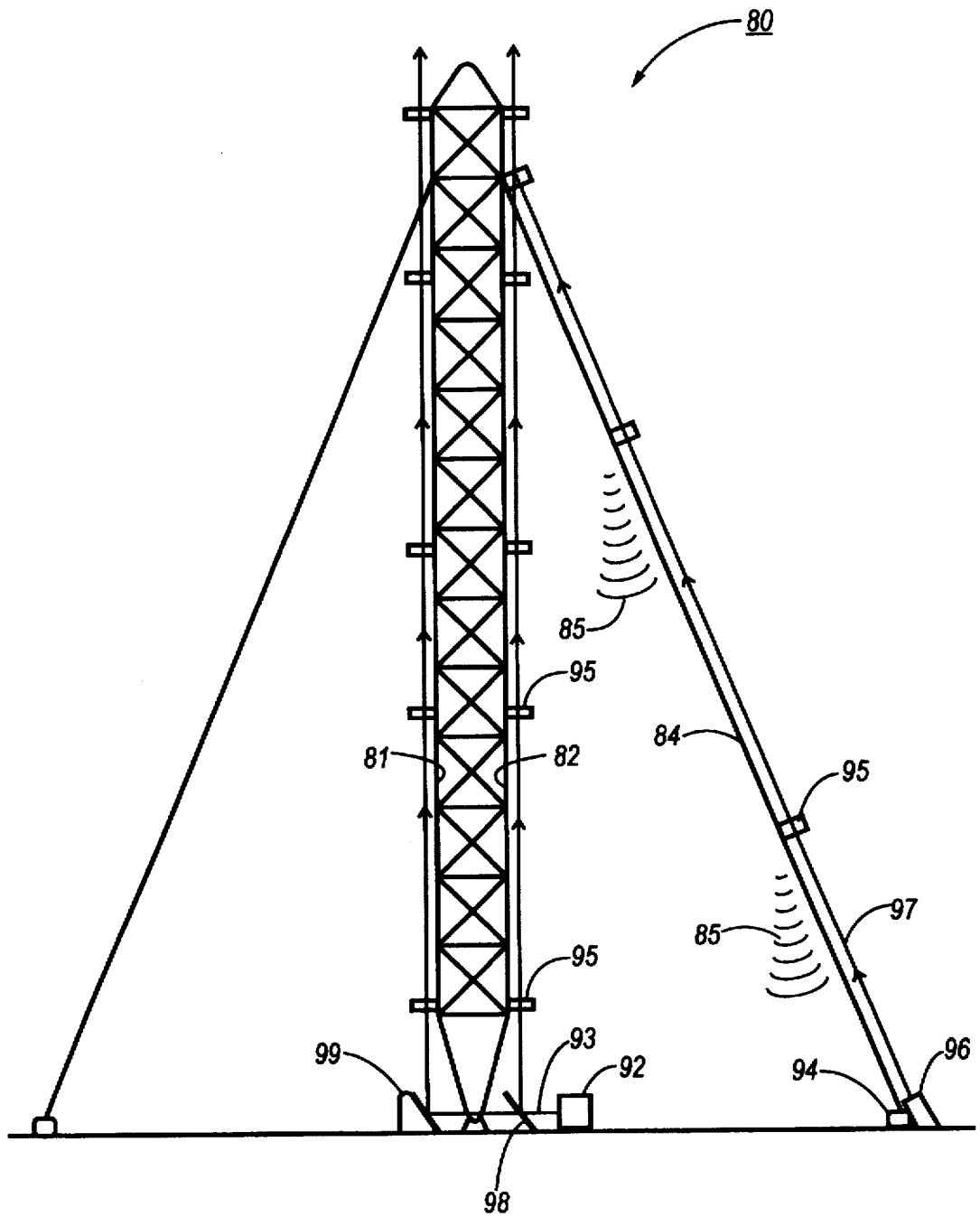
FIG. 4 is a schematic illustration of a tower structure having multiple flexure detection and control systems using partially transparent light beam detectors.

Vibration detection and/or control in buildings, towers, bridges, dams, or other large structures is also contemplated in accordance with the present invention. For example, a tower 80 such as may be used for supporting electrical power lines or having mounted microwave radio links is shown in FIG. 4. The tower 80 includes vertical structural beam elements 81 and 82, as well as supporting wires 84. A motion detection and control system includes multiple partially transparent detectors 95 distributed along both structural beam elements 81 and 82, and supporting wires 84. In operation, a laser source 92 directs a light beam 92 at a beamsplitter 98 and angled reflector 99 to measure movement of the structural beam elements 81 and 82, while a laser 96 directs a beam 97 along wire 84 to similarly measure wire motion. A motion detection and control unit 94 can be used to detect receive wireless signals 85 from each detector 95, and adjust tension of wire 84 to dynamically control motion of tower 80 in real time.

Figure 5:
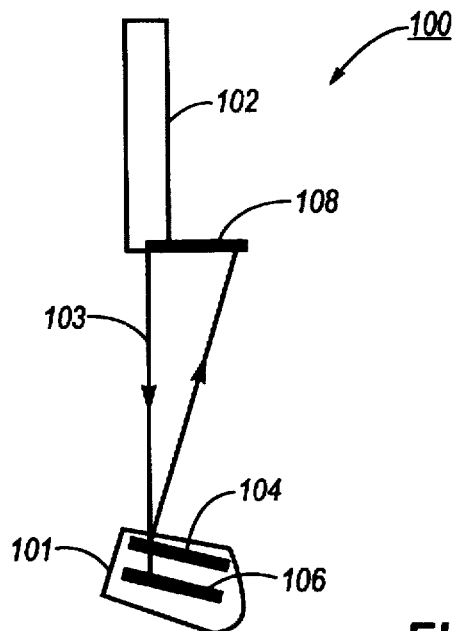
FIGS. 5 and 6 are schematic illustrations showing possible motion detector selection and geometry.

Real time detection of object movement or absolute object positioning using a single laser source and partially transparent, semi-reflective, or opaque detectors can be enabled through various combinations of the foregoing optical elements. For example, FIG. 5 illustrates use of a light beam movement detection system 100 having two conventional opaque light beam detectors 106 and 108 and a partially transparent and semi-reflective light beam detector 104. The system 100 also includes a light source 102 for directing a light beam 103 at the detectors 104, 106, and 108. The detectors 104 and 106 are securely mounted with respect to each other on a movable structural element 101, while the detector 108 is securely fixed with respect to light source 102. If the detectors are at least capable of one dimensional measurements, monitoring movement of the structural element 101 with respect to light source 102 proceeds as discussed in the following with reference to FIG. 6.

Figure 6:
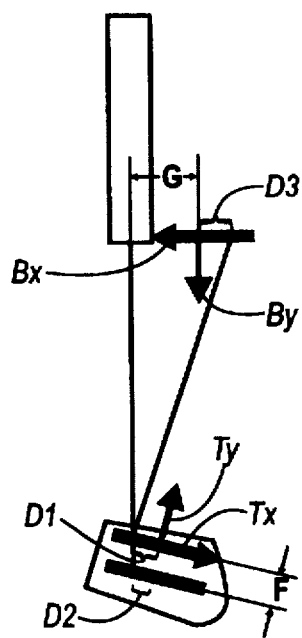

As seen in FIG. 6, a base frame B (Bx and By) is defined with respect to a reference frame located at the midpoint of detector 108, while a target frame T (Tx and Ty) is defined with respect to the attachment of detector 104 to structural element 101. Frame B is attached to coincide with the midpoint of detector 108 with the X axis (Bx) aligning with the axis of measurement of detector 104 and the Y axis (By) being in the plane. The target frame T is attached to coincide with the midpoint of detector 104, with the X axis (Tx) aligning with the axis of measurement of detector 104 and the Y axis (Ty) being in the plane. The light source 102 emits a beam 103 parallel with the Y axis of B and offset from the By axis by a distance G. When the beam 103 strikes the axis of measurement on detector 104, it returns a distance D1 from the midpoint of the detector 104 to that point of intersection (i.e., the midpoint is the origin). Similarly, detector 106 returns D2, and detector 108 returns D3. Detector 104 and 106 are parallel and offset along the Ty axis by a distance F.

The transformation of B to T involves a translation (X,Y) and a rotation ($\Theta$)

$$\Theta = \text{Tan}^{-1}\left(\frac{D1-D2}{F}\right)$$

$$X = D1 \cdot \text{Cos}(\Theta) + G$$

$$Y = D3 \cdot \frac{\text{Cos}(2\Theta)}{\text{Sin}(2\Theta)} + D1 \cdot \text{Sin}(\Theta)$$

Figure 7:
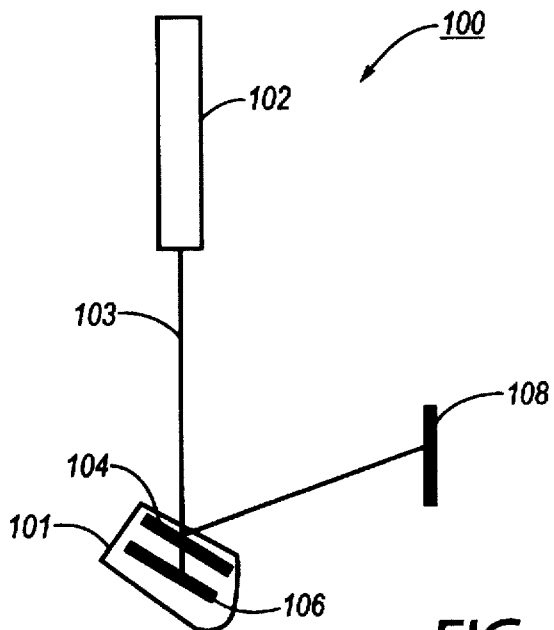
FIGS. 7 and 8 are alternative schematic illustrations showing additional motion detector arrangements.

Note that as the reflected line gets closer to the laser source D3→0 and $\Theta$→0, so $$\frac{\text{Cos}(2\Theta)}{\text{Sin}(2\Theta)} \to \infty,$$

and thus Y becomes undefined. The problems associated with such a configuration can be reduce by use of an alternative configuration that places detector 108 at a position such that the nominal angle of 2$\Theta$ is closer to 90 degrees (for example, see FIG. 7).

Figure 8:
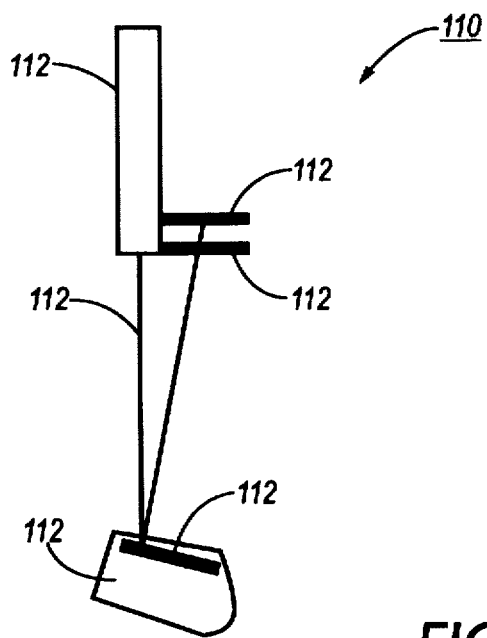

Using appropriate modifications to the foregoing geometric calculations, determination of position using alternative detector configurations is also possible. For example, FIG. 8 illustrates a system 110 using a single semireflective opaque detector 114 mounted on the structural element 111. A semitransparent detector 116 and opaque detector 118 are mounted on a light source 112. Using calculations and information similar to that discussed in connection with FIGS. 5–7, the apparent movement of beam 113 can be monitored and converted into information about relative or absolute movement of structural element 111.

As will be appreciated by those skilled in the art, more position information will be available if the detectors 104, 106, and 108 (or 114, 116, and 118) are two dimensional (with the second measured dimension being perpendicular to the plane), with two dimensional light beam position being measurable. In that case, it is possible to determine the 6-dimensional position and orientation of the object using various detector configurations, including but not limited to those configurations indicated in FIGS. 5–8. However, with either one or two dimensional detectors, fast and precise measurements such as those needed to measure the small motions/vibrations of mechanical parts, are enabled. Advantageously, for vibrations and purely relative motions (velocity measurements)calibration and alignment is not critical to the accuracy of the measurements.

Figure 9:
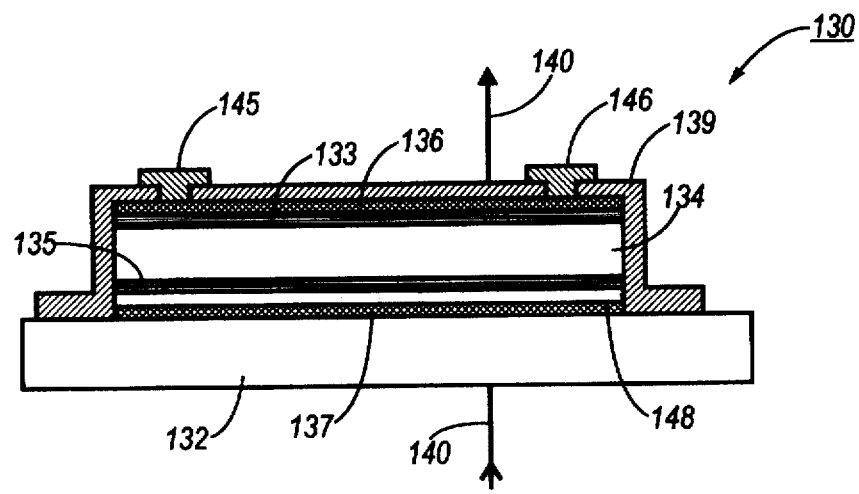
FIGS. 9 and 10 illustrate respectively in cross section and top view a position sensitive detector incorporating transparent p-i-n layers and a transparent substrate.
Figure 10:
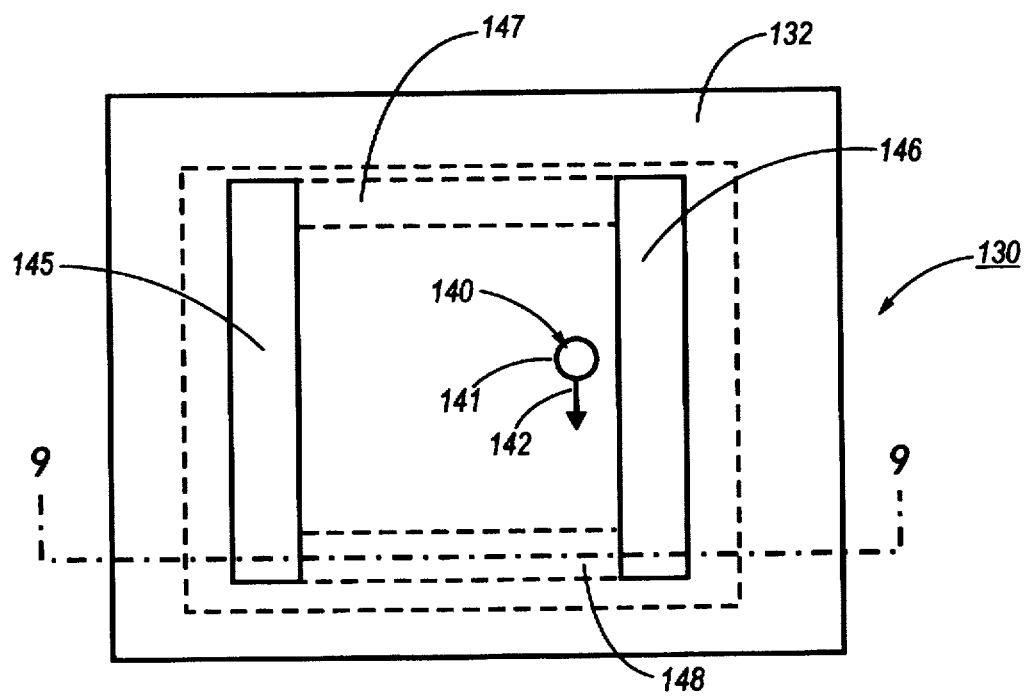

Various semitransparent or semireflective light beam detectors can be used in the present invention. For example, in one embodiment of the invention illustrated in cross section (FIG. 9) and top view (FIG. 10), a lateral effect position sensitive detector 130 (PSD 130) constructed from multiple transparent or semitransparent layers can be used. As compared to conventional PSD's, which are generally opaque to maximize light capture, a PSD in accordance with the present invention must be constructed so that all it layers are transparent or semitransparent to allow entry and exit of a light beam. As seen in FIGS. 9 and 10, the PSD 130 includes a transparent substrate 132, a pair of bottom electrodes 147 and 148 positioned along two edges of the PSD 130, and a bottom transparent resistance layer 137 in direct contact with substrate 132, except where it overlays the electrodes 147 and 148. Layered on top of resistance layer 137 is a conventional p-i-n photodetector having a n-doped layer 135, an intrinsic layer 134, and a p-doped layer 133. The PSD 130 is completed by a top transparent resistance layer 136, a pair of top electrodes 145 and 146, and a passivation dielectric layer 139. Conventional materials and processes can be used to construct PSD 130, provided that the applied materials are transparent, semitransparent, or substantially transparent to selected light wavelengths (whether optical, infrared, or ultraviolet). For example, the substrate 132 can be constructed from optically transparent glass, or semitransparent sapphire. The intrinsic layer 134 can be constructed of amorphous silicon, while the p- and n-layers 133 and 135 can be constructed of appropriately doped amorphous silicon. The passivation dielectric layer 139 can be constructed from transparent polymers, or more commonly, from indium-tin-oxide (ITO) layers. While the electrodes 145, 146, 147, and 148 can be optionally transparent, because of their lateral positioning along the edge of the PSD 130 it is also possible to use conventional metallic contacts such as deposited aluminum.

Figure 11:
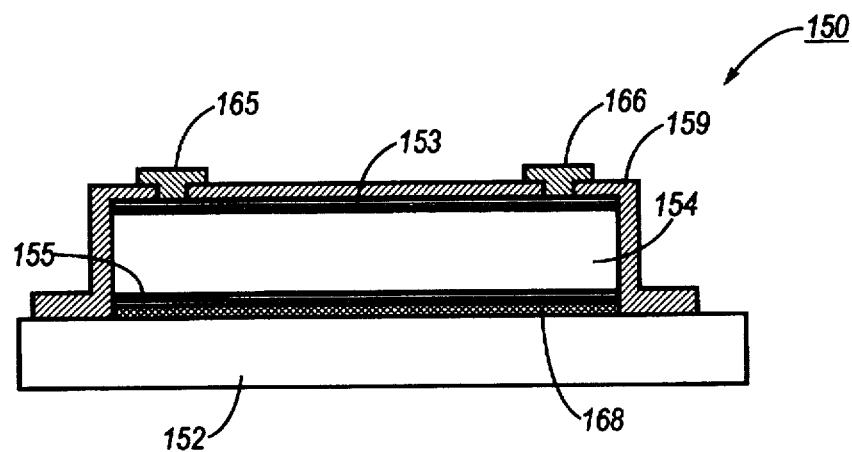
FIGS. 11 and 12 illustrate respectively in cross section and top view a position sensitive detector incorporating transparent doped amorphous silicon and a transparent substrate.
Figure 12:
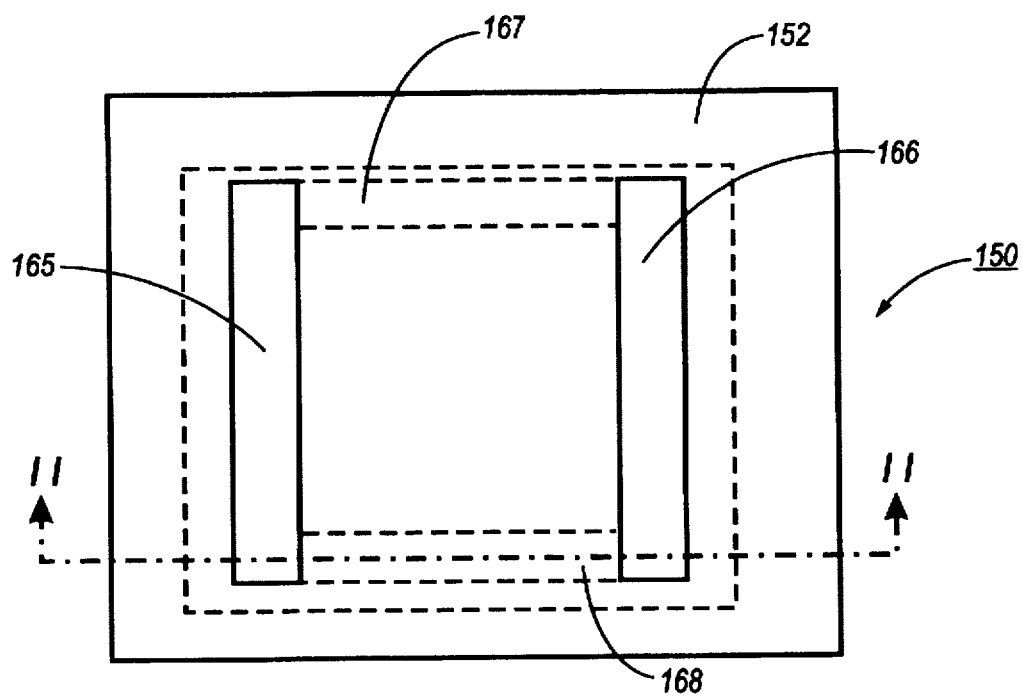

As seen in FIGS. 9 and 10, because PSD 130 is at least partially transparent, in operation a light beam 140 can pass through it, with a portion of the light beam being converted into an electrical current in the intrinsic layer 134 that laterally migrates to the edge positioned electrodes 145, 146, 147, and 148. Based on detected current flowing between the pairs of electrodes (i.e. 145–146 and 147–148), a highly accurate determination of the centroid 141 of the light beam 140 can be made. The horizontal position "h" between top electrodes 145 and 146 is given by:

$$h=(I1-I2)/(I1+I2)L$$

and the vertical position between bottom electrodes 147 and 148 is given by $$v=(I3-I4)/(I3+I4)L$$

where I1 is current measured at electrode 145, I2 is current measured at electrode 146, I3 is current measured at electrode 147, I4 is current measured at electrode 148, and L is one half the distance between each pair of electrodes, with the distance being measured with respect to the center of the PSD 130. Even slight two dimensional movements of the light beam 140 (indicated by arrows 142) are reliably converted into relative or absolute position changes using suitable detector electronics such as described previously in connection with FIG. 1 of the present application. Alternative transparent PSD construction techniques can be employed in the present invention. As illustrated in cross section (FIG. 11) and top view (FIG. 12), a lateral effect position sensitive detector 150 (PSD 150) constructed without top or bottom resistance layers to increase detector transparency can be used. Like PSD 130, the novel highly transparent PSD 150 readily allows entry and exit of a light beam. As seen in FIGS. 11 and 12, the PSD 150 includes a transparent substrate 152 and a pair of bottom electrodes 167 and 168 positioned along two edges of the PSD 150. Layered on top of substrate 152 is a conventional p-i-n photodetector having a n-doped layer 155, an intrinsic layer 154, and a p-doped layer 153. The PSD 150 is completed by a pair of top electrodes 165 and 166, and a passivation dielectric layer 159. Like PSD 130, conventional materials and processes can be used to construct PSD 150, provided that the applied materials are transparent, semitransparent, or substantially transparent to selected light wavelengths (whether optical, infrared, or ultraviolet). Because of its generally suitable spreading sheet resistance, the intrinsic layer 154 can be constructed of amorphous silicon, while the p- and n-layers 153 and 155 can be constructed of appropriately doped amorphous silicon. The passivation dielectric layer 159 can be constructed from transparent polymers, or more commonly, from indium-tin-oxide (ITO) layers. While the electrodes 165, 166, 167, and 168 can be optionally transparent, because of their lateral positioning along the edge of the PSD 150 it is possible to use conventional metallic contacts such as deposited aluminum. Operation of PSD 150 is substantially the same as previously discussed in conjunction with PSD 130 of FIGS. 9 and 10.

Figure 13:
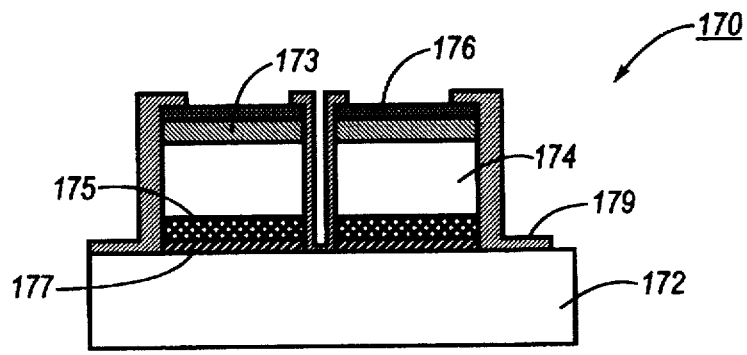
FIGS. 13 and 14 illustrate respectively in cross section and top view a plurality of transparent photodiodes mounted on a transparent substrate.
Figure 14:
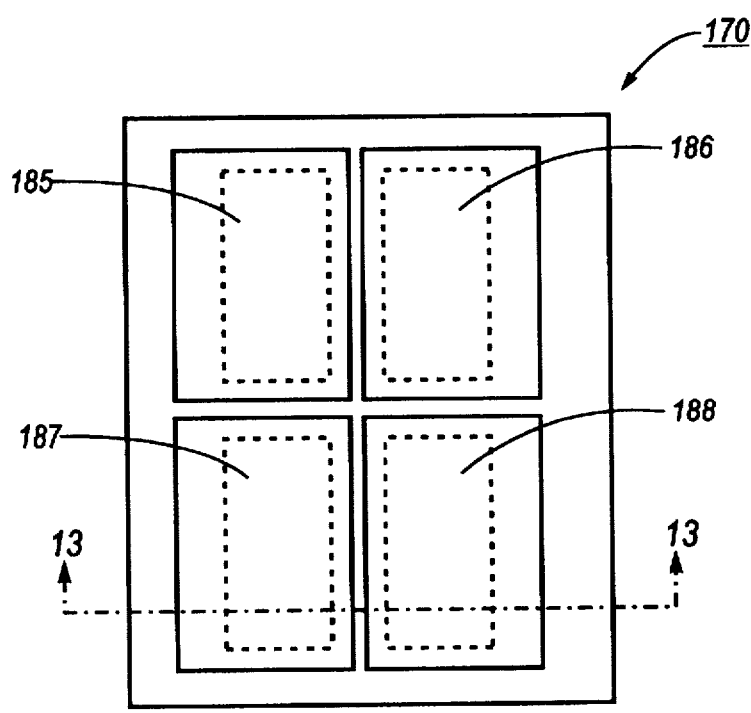

Other light beam detector systems are also suitable for use in the present invention. For example, multiple arrays of photodiodes modified to have transparent or semitransparent detector layers and substrate can be used to track position of a passing light beam. This is best illustrated in cross section (FIG. 13) and top view (FIG. 14), where a photodiode light detector array 170 consisting of four detectors 185, 186, 187, and 188 is constructed from multiple segmented transparent or semitransparent layers deposited on a common transparent substrate 172. Each detector 185, 186, 187, and 188 includes a transparent bottom contact 177, on top of which is layered a conventional p-i-n photodetector having a n-doped layer 175, an intrinsic layer 174, and a p-doped layer 173. Each detector 185, 186, 187, and 188 is completed by a top contact 176 and a passivation dielectric layer 179. Conventional materials and processes similar to that discussed in conjunction with PSD 130 can be used to construct photodiode light detector array 170.

In operation, each detector 185, 186, 187, and 188 provides an electrical signal representative of total integrated light falling on the detector. When a light beam overlapping each detector passes through, a portion of the light beam is converted into an electrical current in each detector. Based on detected current from each detector 185, 186, 187, and 188, a highly accurate determination of the centroid of a light beam can be made. The horizontal position "h" is given by:

$$h=2L[(I1+I3)-(I2+I4)]/\Sigma I$$

and the vertical position is given by $$v=2L[(I1+I2)-(I3+I4)]/\Sigma$$

where I1 is current measured at detector 185, I2 is current measured at detector 186, I3 is current measured at detector 187, I4 is current measured at detector 188, $\Sigma I=I1+I2+I3+I4$, and L is one half the linear width of the group of detectors 185, 186, 187, and 188 forming detector 170. As with PSD 130, even slight two dimensional movements of a light beam result in changes in current from the detectors, which changes can be translated in relative or absolute position changes using suitable detector electronics such as described previously in connection with FIG. 1.

Figure 15:
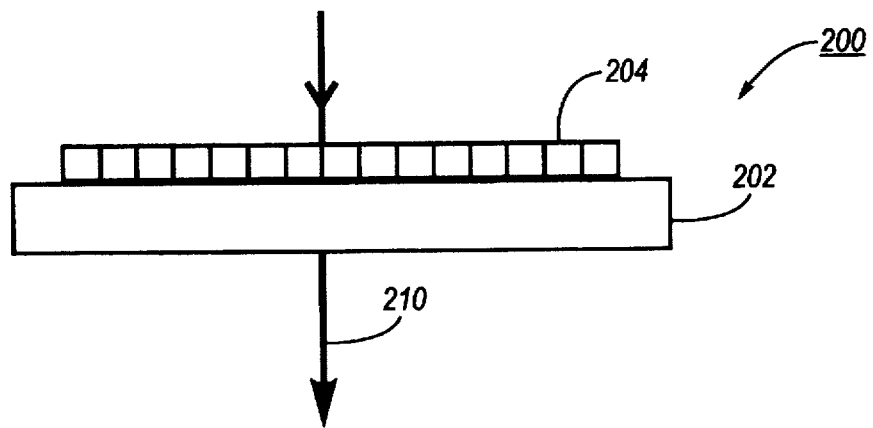
FIGS. 15 and 16 illustrate respectively in cross section and top view a transparent CCD imaging sensor mounted on a transparent substrate.
Figure 16:
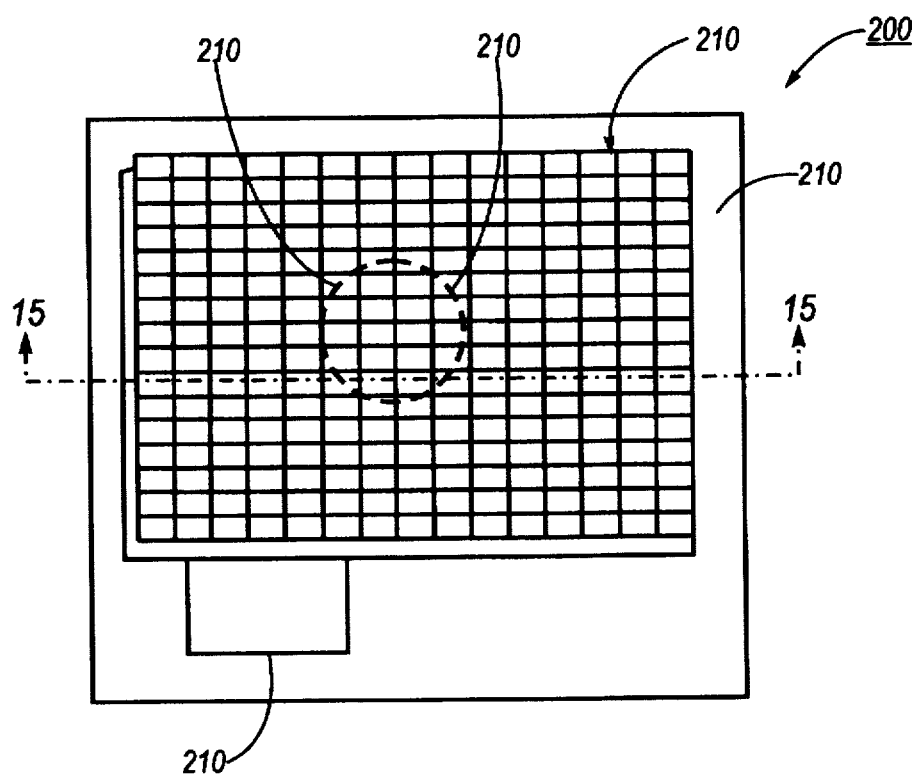

Yet another possible detector architecture useful in conjunction with the present invention is a transparent or semitransparent CCD imaging sensor array. This is best illustrated in cross section (FIG. 15) and top view (FIG. 16), where a CCD image array 200 consisting of a large two dimensional array of detector elements 204 (pixel elements) is constructed from multiple segmented transparent or semitransparent layers deposited on a common substrate 202. The substrate 202 can be a sapphire or transparent insulator substrate such as used for making radiation-hardened electronic devices for military and space-based applications. Electronic circuitry 206 (with optional edge detection circuitry and digital compression) to read array 200 data and transform it into a compressed digital position reading could be included on the same silicon substrate. Advantageously, such an array 200 produces a digital signal with very high noise immunity. By providing sensing on a pixel element-by-pixel element basis and edge-detection circuitry for tracking edges of the intercepted light spot 211 of light beam 210, the use of a CCD array 200 can provide greater immunity to the effects of ambient light sources and to the effects of laser light that might be scattered by other sensors mounted nearby on structural elements.

Figure 17:
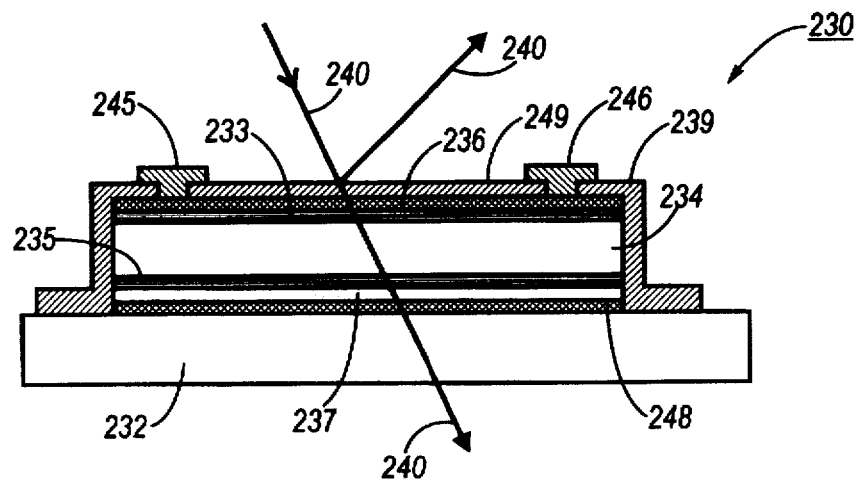
FIGS. 17 and 18 illustrate respectively in cross section and top view a position sensitive detector having a partially reflective top layer.
Figure 18:
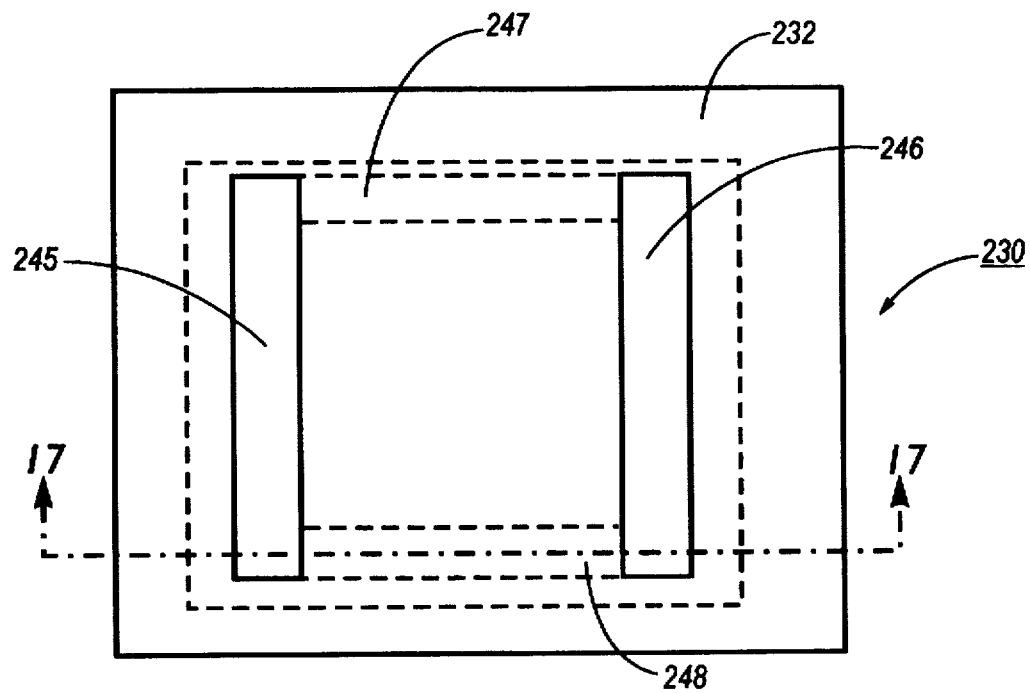

An example of how this digital compression/edge detection using onboard electronic circuitry 206 could work is as follows. A typical CCD produces a serial stream of data corresponding to the intensity of each pixel in the array. This serial signal is threshold filtered to produce a serial stream of "edge-crossings", e.g. transitions from light to dark or dark to light. This serial stream of edge-crossings would optionally be filtered by the electronic circuitry 206 to detect the distance between the edge-crossings and to determine whether the width of each bright spot corresponds to the expected width of the laser light (with bright spots consisting of two edge crossings). The output of this filtering process could be either a sequence of edge crossings or simply a sequence of markers reflecting where the center of each bright spot is as seen in the following Table 1:

In certain embodiments of the invention such as discussed in connection with FIGS. 2 and 3, and FIGS. 5–8, semireflective detectors are useful for redirecting or splitting a light beam. An example of such a detector is illustrated in cross section (FIG. 17) and top view (FIG. 10), a lateral effect position sensitive detector 230 (PSD 230) similar to that discussed in connection with FIGS. 9 and 10, but having an additional semireflective layer 249. The semireflective layer 249 can reflect a portion of an incoming light beam 240 toward another detector (not shown) while still allowing a portion of the light beam to enter and exit the PSD 230. As seen in FIGS. 17 and 18, the PSD 230 includes a transparent substrate 232 (or optionally opaque substrate, if passage of light therethrough is not necessary for a given configuration of stacked detectors), a pair of bottom electrodes 247 and 248 positioned along two edges of the PSD 230, and a bottom transparent resistance layer 237 in direct contact with substrate 232, except where it overlays the electrodes 247 and 248. Layered on top of resistance layer 237 is a conventional p-i-n photodetector having a n-doped layer 235, an intrinsic layer 234, and a p-doped layer 233. The PSD 230 is completed by a top transparent resistance layer 236, a pair of top electrodes 245 and 246, and a passivation dielectric layer 239 for covering those portions of the detector not covered by top semireflecting layer 249. Materials, construction and operation of detector 230 is otherwise similar to that discussed previously in connection with FIGS. 9 and 10.

While the present invention has been described in conjunction with specific embodiments thereof, it is evident that many alternatives, modifications, and variations will be apparent to those skilled in the art. Accordingly, the various embodiments described herein should be considered illustrative, and not limiting the scope of the present invention as defined in the following claims.

What is claimed is:

1. A position sensitive detector comprising
   a transparent substrate,

TABLE 1

| Location in stream | 1 | 2 | 3 | | 47 | 48 | 49 | 50 | | 79 | 80 | 81 |
|---|---|---|---|---|---|---|---|---|---|---|---|---|
| Raw CCD data: | 200 | 201 | 199 | ... | 500 | 515 | 490 | 220 | ... | 220 | 180 | 200 |
| Edge crossings: | 0 | 0 | 0 | ... | 1 | 0 | 0 | 1 | ... | 0 | 0 | 0 |
| If width of 3 is valid: | | | | | | | | | | | | |
| Stream of spot centers: Output | 0 | 0 | 0 | ... | 0 | 1 | 0 | 0 | ... | 0 | 0 | 0 |
| If width of 3 does not correspond to laser signal: | | | | | | | | | | | | |
| Stream of spot centers: | 0 | 0 | 0 | ... | 0 | 0 | 0 | 0 | ... | 0 | 0 | 0 |

The stream of spot centers can be counted to summarize the results by producing a location reading that corresponds to the location of the bright spots in the data stream, in this case "48". Depending on the resolution desired, this result can be transmitted as is, or in summarized form (as a two-bit number summarizing within which quadrant the light beam is detected). Optionally, the digital 'location' result can be transformed into an analog signal whose voltage corresponds to the location relative to the beginning of the CCD array 200, allowing one to effectively simulate a linear potentiometer attached to the beam.

As will be appreciated by those skilled in the art, variants on the above filtering scheme may be implemented via a programmable digital computer or microprocessor co-located on the same or separate silicon substrate as the CCD array itself, and may be enhanced by more elaborate edge-crossing and noise-reduction algorithms (such as gaussian spatial averaging).

a plurality of layers on the substrate, with at least one of the plurality of layers generating electrical current in response to a light beam, with light transparency of the combination of transparent substrate and the plurality of layers allowing at least some of a light beam entering the position sensitive detector to exit.

2. The position sensitive detector of claim 1, wherein the plurality of layers further comprises a p-i-n light detector for generating electrical current in response to a light beam.

3. The position sensitive detector of claim 2, further comprising top and bottom resistance sheet layers respectively positioned on each side of the p-i-n light detector.

4. The position sensitive detector of claim 1, further comprising transparent edge electrodes.

5. The position sensitive detector of claim 1, further comprising an intrinsic layer of amorphous silicon.

6. The position sensitive detector of claim 1, wherein the transparent substrate is glass.

7. The position sensitive detector of claim 1, wherein the p-i-n detector further comprises p-doped amorphous silicon and n-doped amorphous silicon.

8. The position sensitive detector of claim 1, further comprising a semireflective layer for reflecting at least some of a light beam.

9. The position sensitive detector of claim 1, further comprising a p-i-n detector having an amorphous, silicon intrinsic layer, a layer of p-doped amorphous silicon, and a layer of n-doped amorphous silicon, with the position sensitive detector allowing at least half of entering light to exit.

10. A system for detecting light beam movement comprises a first partially transparent light beam detector allowing at least some of an entering light beam to exit, and a second partially transparent light beam detector positioned to intercept an exiting light beam from the first partially transparent light beam detector, with the second light beam detector being partially transparent to allow at least some of the entering light beam to exit.

11. The system of claim 10, wherein the first partially transparent light beam detector is a position sensitive detector.

12. The system of claim 11, wherein each position sensitive detector comprises a p-i-n light detector for generating electrical current in response to a light beam.

13. The position sensitive detector of claim 12, further comprising top and bottom resistance sheet layers respectively positioned on each side of each p-i-n light detector.

14. The position sensitive detector of claim 11, wherein each position sensitive detector further comprises a p-i-n detector having an amorphous silicon intrinsic layer, a layer of p-doped amorphous silicon, and a layer of n-doped amorphous silicon, with the position sensitive detector allowing at least half of entering light to exit.

15. The system of claim 10, wherein the first partially transparent light beam detector is a position sensitive detector having a semireflective layer to partially reflect light.

16. The system of claim 10, wherein the first partially transparent light beam detector is an array of photodetectors, each photodetector providing a signal indicating light intensity.

17. The system of claim 10, wherein the first partially transparent light beam detector is a partially transparent CCD imaging array.

18. The system of claim 10, further comprising an opaque third light beam detector for preventing exit of light.

19. The system of claim 10, wherein the directed light source is a laser.

20. A vibration detection system comprising a vibration susceptible structural element, a plurality of light beam detectors for generating signals corresponding to light beam position, the plurality of light beam detectors including at least two partially transparent light beam detectors attached to the vibration susceptible structural element, the partially transparent light beam detector positioned to allow passage therethrough of light beams, with relative detected movement of light beams with respect to the partially transparent light beam detector corresponding to movement of the vibration susceptible structural element.

21. The vibration detection system of claim 20, further comprising a vibration suppression unit connected to the plurality of light beam detectors to receive signals corresponding to light beam position, with the vibration suppression unit attached to the vibration susceptible structural element for suppressing vibrations detected by the plurality of light beam detectors.

* * * * *